(12) United States Patent
Toyoda

(10) Patent No.: US 8,604,113 B2
(45) Date of Patent: Dec. 10, 2013

(54) PHOTOSENSITIVE RESIN COMPOSITION, INSULATING FILM, PROTECTIVE FILM, AND ELECTRONIC EQUIPMENT

(75) Inventor: Hideyuki Toyoda, Utsunomiya (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 654 days.

(21) Appl. No.: 12/443,294

(22) PCT Filed: Nov. 13, 2007

(86) PCT No.: PCT/JP2007/071951
§ 371 (c)(1),
(2), (4) Date: Mar. 27, 2009

(87) PCT Pub. No.: WO2008/059808
PCT Pub. Date: May 22, 2008

(65) Prior Publication Data
US 2010/0076156 A1    Mar. 25, 2010

(30) Foreign Application Priority Data
Nov. 15, 2006   (JP) ................................ 2006-309287

(51) Int. Cl.
*C08K 5/13* (2006.01)

(52) U.S. Cl.
USPC ........... 524/323; 524/324; 524/342; 524/345; 524/346

(58) Field of Classification Search
USPC .................. 524/612, 323, 324, 342, 345, 346
See application file for complete search history.

(56) References Cited

U.S. PATENT DOCUMENTS

| | | | | |
|---|---|---|---|---|
| 2,160,293 A | * | 5/1939 | Shoemaker et al. | 508/255 |
| 5,869,229 A | * | 2/1999 | Okada et al. | 430/619 |
| 6,160,081 A | * | 12/2000 | Tanaka et al. | 528/170 |
| 2003/0145908 A1 | * | 8/2003 | Fukumura et al. | 148/254 |
| 2004/0101794 A1 | * | 5/2004 | Usagawa et al. | 430/619 |
| 2004/0259020 A1 | * | 12/2004 | Banba et al. | 430/154 |

FOREIGN PATENT DOCUMENTS

| | | |
|---|---|---|
| EP | 1 491 952 | 12/2004 |
| JP | 06184771 A * | 7/1994 |
| JP | 2004-85622 | 3/2004 |
| JP | 2004-132994 | 4/2004 |
| JP | 2005-173528 | 6/2005 |
| JP | 2005-336125 | 12/2005 |
| JP | 2006-184660 | 7/2006 |
| JP | 2006-309202 | 11/2006 |

OTHER PUBLICATIONS

Machine translation of JP 06184771 A.*
Supplementary Partial European Search Report for Application No. EP 07 83 1681 dated Nov. 3, 2009.
International Search Report, Dec. 18, 2007.

* cited by examiner

Primary Examiner — Ling Choi
Assistant Examiner — Wenwen Cai
(74) Attorney, Agent, or Firm — Smith, Gambrell & Russell, LLP

(57) ABSTRACT

The photosensitive resin composition of the present invention includes an alkali solubility resin including molecules each composed of a main chain having one end and the other end opposite to the one end, an organic group bonded to the one end thereof, the organic group having at least one unsaturated group, and a substituent group bonded to at least one of the other end of the main chain and a branch thereof, the substituent group having a cyclic chemical structure containing nitrogen atoms, and a photosensitive agent. Further, the insulating film of the present invention is composed of a cured product of the above photosensitive resin composition. Furthermore, the protective film of the present invention is composed of a cured product of the above photosensitive resin composition. Moreover, the Electronic equipment of the present invention is provided with the above protective film and insulating film.

10 Claims, 1 Drawing Sheet

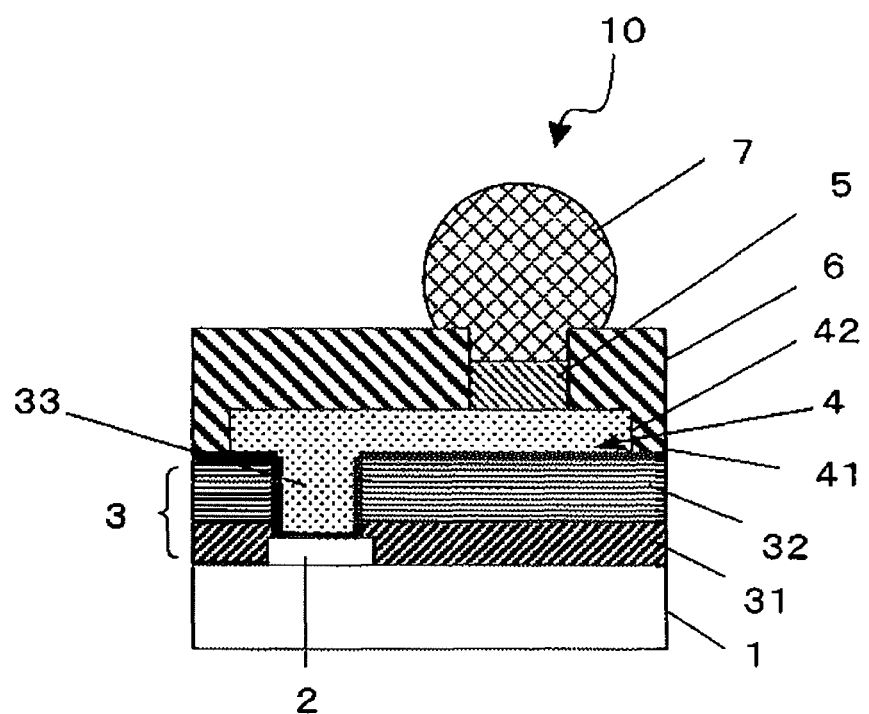

PHOTOSENSITIVE RESIN COMPOSITION, INSULATING FILM, PROTECTIVE FILM, AND ELECTRONIC EQUIPMENT

TECHNICAL FIELD

The present invention relates to a photosensitive resin composition, an insulating film, a protective film, and electronic equipment.

BACKGROUND ART

Recently, a semiconductor element is formed by laminating a plurality of wiring layers for downsizing it or high integration thereof. Further, a type of the semiconductor element is changed to a chip size package (CSP) or a wafer level package (WLP).

For these reasons, a case that a surface protective film and an interlayer insulating film are directly formed on a metal wiring (which is generally made of copper, copper alloy or the like) of the wiring layer is increased.

Therefore, adhesiveness between the films and the wiring made of copper, copper alloy or the like affects reliability of the semiconductor element remarkably. As a result, a film having high adhesiveness to the wiring made of copper, copper alloy or the like is required.

Further, from the viewpoint of a property and productivity of a package, it is required that the surface protective and interlayer insulating films (cured films) can be obtained through a curing treatment having a low curing temperature of 200 to 300° C., and have an excellent mechanical property such as elongation percentage.

In the case where the surface protective and interlayer insulating films can be obtained through the curing treatment having the low curing temperature, it is possible to prevent occurrence of damage due to heat in a high integration semiconductor element, and to improve productivity thereof.

For such a requirement, although there are known methods in which an additive ingredient is added to resin compositions for constituting the films in order to improve adhesiveness between the films and the copper and copper alloy (See, for example, Patent Document 1: Japanese Patent Application Laid-open No. 2005-336125 and Patent Document 2: Japanese Patent Application Laid-open No. 2005-173528), such methods could not improve the above adhesiveness sufficiently.

Further, for example, in the case of a package provided with an insulating film obtained by curing a conventional resin composition at a low curing temperature, when solder balls were mounted onto the package, there was a case that appearance abnormalities such as rucks and cracks occurred on a surface of the insulating film due to a treatment using a flux or the like.

DISCLOSURE OF THE INVENTION

It is therefore an object of the present invention to provide a photosensitive resin composition which has excellent adhesiveness to a wiring made of copper and copper alloy and can be cured at a low temperature, and to provide an insulating film, a protective film and electronic equipment each obtained by using the photosensitive resin composition.

In order to achieve the object described above, the present invention is directed to a photosensitive resin composition. The photosensitive resin composition includes an alkali solubility resin including molecules each composed of a main chain having one end and the other end opposite to the one end, an organic group bonded to the one end thereof, the organic group having at least one unsaturated group, and a substituent group bonded to at least one of the other end of the main chain and a branch thereof, the substituent group having a cyclic chemical structure containing nitrogen atoms and a photosensitive agent.

In the above photosensitive resin composition, it is preferred that the substituent group has a tetrazole group as the cyclic chemical structure containing nitrogen atoms.

In the above photosensitive resin composition, it is preferred that the substituent group has at least one of chemical structures represented by the following formulas (1-1) and (1-2).

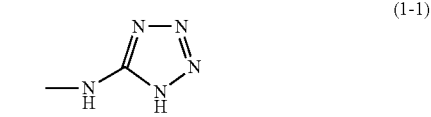

(1-1)

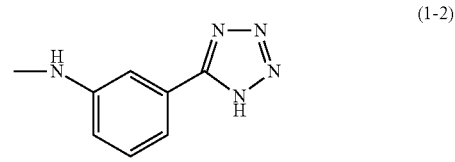

(1-2)

In the above photosensitive resin composition, it is preferred that an amount of the cyclic chemical structures containing nitrogen atoms is in the range of 1.0 to 10.0 wt % with respect to a total weight of the molecules included in the alkali solubility resin.

In the above photosensitive resin composition, it is preferred that the organic group having the at least one unsaturated group is an organic group having at least one triple bond.

In the above photosensitive resin composition, it is preferred that the main chain of each of the molecules included in the alkali solubility resin has at least one of a chemical structure which can change to a polybenzoxazole structure and a chemical structure which can change to a polyimide structure.

Further, the present invention is directed to an insulating film. The insulating film is composed of a cured product of the above photosensitive resin composition.

Furthermore, the present invention is directed to a protective film. The protective film is composed of a cured product of the above photosensitive resin composition.

In the above protective film, it is preferred that the protective film is used for protecting a semiconductor element or a liquid crystal display element.

Moreover, the present invention is directed to electronic equipment. The electronic equipment is provided with the protective film.

Moreover, the present invention is directed to electronic equipment. The electronic equipment is provided with the insulating film.

BRIEF DESCRIPTION OF THE DRAWINGS

FIG. 1 is a sectional view showing one example of a semiconductor device.

BEST MODE FOR CARRYING OUT THE INVENTION

Hereinbelow, a photosensitive resin composition, an insulating film, a protective film, and electronic equipment according to the present invention will be described.

The photosensitive resin composition according to the present invention includes an alkali solubility resin including molecules each composed of a main chain having one end and the other end opposite to the one end, an organic group bonded to the one end thereof, the organic group having at least one unsaturated group, and a substituent group bonded to at least one of the other end of the main chain and a branch thereof, the substituent group having a cyclic chemical structure containing nitrogen atoms, and a photosensitive agent.

Further, the insulating film according to the present invention is composed of a cured product of the above described photosensitive resin composition.

Furthermore, the protective film according to the present invention is composed of a cured product of the above described photosensitive resin composition.

Moreover, the electronic equipment according to the present invention is provided with the above described protective film.

Moreover, the electronic equipment according to the present invention is provided with the above described insulating film.

First, the photosensitive resin composition, the insulating film, and the protective film will be described.

As shown in FIG. 1, a semiconductor device 10 includes a silicon wafer 1, an aluminum pad 2 provided on a part of the silicon wafer 1 (a part of an upper surface of the silicon wafer 1 in FIG. 1), and a protective film 3 provided so as to cover the upper surface of the silicon wafer 1 other than the aluminum pad 2.

Further, the semiconductor device 10 includes a conductor portion 4 formed on an upper side of the protective film 3, an insulating film 6 provided so as to remain a barrier metal 5 joined to the conductor portion 4 and cover the conductor portion 4, and a solder bump 7 provided on the barrier metal 5 for electrically connecting an external electrode.

The protective film 3 is composed from a passivation film 31 and a buffer coating film 32. The passivation film 31 is joined to the silicon wafer 1. A concave portion 33 is formed through the passivation film 31 and the buffer coating film 32 so that the aluminum pad 2 is exposed inside the concave portion 33.

The conductor portion 4 is composed from a metal film 41 and a pad portion 42. The metal film 41 is provided on an upper surface of the buffer coating film 32 and an inner surface of the concave portion 33, and the pad portion 42 is filled into the concave portion 33 and electrically connected to the solder bump 7.

The pad portion 42 is composed from a metal wiring made of copper or copper alloy. The barrier metal 5 is joined to the pad portion 42 on a lower side thereof.

The photosensitive resin composition of the present invention is preferably used for constituting the buffer coating film 32, the insulating film 6 and the like included in the semiconductor device 10 as described above.

However, the photosensitive resin composition of the present invention is especially preferably used for constituting the insulating film 6 which is directly joined to the metal wiring. This makes it possible to provide a semiconductor device 10 having excellent reliability.

Such a photosensitive resin composition includes an alkali solubility resin and a photosensitive agent. The alkali solubility resin includes molecules each composed of a main chain having one end and the other end opposite to the one end, an organic group bonded to the one end thereof, the organic group having at least one unsaturated group, and a substituent group bonded to at least one of the other end of the main chain and a branch thereof, the substituent group having a cyclic chemical structure containing nitrogen atoms.

This makes it possible to improve adhesiveness of a cured film, which is obtained by curing a film made of the photosensitive resin composition, to the metal wiring made of copper and copper alloy, in a state that the cured film maintains a mechanical property such as elongation percentage.

(Alkali Solubility Resin)

Next, the alkali solubility resin, which is a main component contained in the photosensitive resin composition, will be described.

Examples of the alkali solubility resin include cresol type novolak resin, hydroxy styrene resin, acrylate based resin such as methacrylate resin or methacrylic acid ester resin, cyclic olefin based resin containing hydroxyl group(s), carboxyl group(s) or the like, polyamide based resin, and the like. Among these alkali solubility resins, the polyamide based resin is preferably used.

Specifically, examples of such a polyamide based resin include: a resin including molecules each composed of a main chain having at least one of a polybenzoxazole structure and a polyimide structure, and at least one kind of hydroxyl group(s), carboxyl group(s), ether bond(s) and ester bond(s) each bonded to or contained in the main chain; a resin including molecules each having a polybenzoxazole precursor structure (that is, a chemical structure which can change to a polybenzoxazole structure); a resin including molecules each having a polyimide precursor structure (that is, a chemical structure which can change to a polyimide structure); a resin including molecules each having a polyamide acid ester structure; and the like.

Such a polyamide based resin may include molecules each represented by the following formula (2).

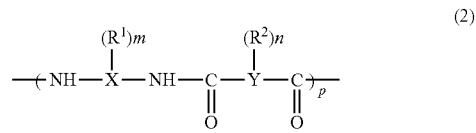

wherein X is a group having a cyclic chemical structure; $R^1$ is a hydroxyl group, O—$R^3$, an alkyl group, an acyloxy group or a cycloalkyl group; m is an integral number of 0 to 2; and $R^1$ is the same or different in each repeating unit;

wherein Y is a group having a cyclic chemical structure; $R^2$ is a hydroxyl group, a carboxyl group, O—$R^3$, COO—$R^3$, CO—$R^{10}$; n is an integral number of 0 to 4; and $R^2$ is the same or different in each repeating unit;

wherein a carbon number of $R^3$ is in the range of 1 to 15; and $R^{10}$ is a group having a cyclic chemical structure containing nitrogen atoms;

wherein in all repeating units, when each $R^1$ is not the hydroxyl group, at least one of $R^2$s is the carboxyl group, or when each $R^2$ is not the carboxyl group, at least one of $R^1$s is the hydroxyl group; and wherein p is an integral number of 2 to 300.

Each molecule (polyamide based resin) represented by the general formula (2) may be obtained by reacting a compound selected from the groups comprising diamine, bis(aminophenol) and diaminophenol each having the chemical structure of the above mentioned X, and a compound selected from the groups comprising tetracarboxylic acid anhydride, trimellitic acid anhydride, dicarboxylic acid, dicarboxylic acid dichloride, a dicarboxylic acid derivative, hydroxydicarboxylic acid and a hydroxydicarboxylic acid derivative each having the chemical structure of the above mentioned Y with each other.

In the case of using the dicarboxylic acid, the dicarboxylic acid is converted into an activated ester type dicarboxylic acid derivative by reacting, in advance, it with 1-hydroxy-1,2,3-benzotriazole or the like, and the activated ester type dicarboxylic acid derivative may be used in the above reaction. This makes it possible to improve a reaction yield of the molecules each represented by the general formula (2) constituting (included in) the polyamide based resin.

In the case where the molecules each represented by the general formula (2) are heated at a temperature of about 150 to 400° C., they are dehydrated and cyclized. As a result, thermostable resin such as polyimide, polybenzotriazole or a copolymer of the polyimide and the polybenzotriazole can be obtained.

As described above, the X shown in the general formula (2) is the group having the cyclic chemical structure, and examples of the group having the cyclic chemical structure include a group having an aromatic ring such as a benzene ring or a naphthalene ring, a group having a bisphenol structure, a group having a hetero ring such as a pyrrole ring or a furan ring, and the like.

Specifically, a group represented by the following formula (3) is preferably selected as the group having the cyclic chemical structure (that is, the X).

As described above, the $R^1$ is the hydroxyl group or the O—$R^3$, and the $R^3$ is an organic group having the carbon number of 1 to 15. Concrete examples of the $R^3$ include a formyl group, a methyl group, an ethyl group, a propyl group, an isopropyl group, a tertiary butyl group, a tertiary butoxycarbonyl group, a phenyl group, a benzyl group, a tetrahydrofuranyl group, a tetrahydropyranyl group, and the like. The above $R^a$s are used for adjusting solubility of the polyamide based resin in an alkaline aqueous solution.

Among these groups, the X is especially preferably selected from the formula (3-1), the formula (3-2) and the formula (3-3), and two or more of the groups selected may be used in combination. This makes it possible to especially improve workability of a patterning of the photosensitive resin composition, a film physical property and flux resistance (low temperature curability) of a cured film which is obtained by curing the film.

As described above, the Y shown in the general formula (2) is the group having the cyclic chemical structure, and is selected from the same one described in the X. Examples of the group having the cyclic chemical structure include a group having an aromatic ring such as a benzene ring or a naphthalene ring, a group having a bisphenol structure, a group having a hetero ring such as a pyrrole ring, a furan ring or a pyridine ring, and the like.

Specifically, a group represented by the following formula (4) is preferably selected as the group having the cyclic chemical structure (that is, the Y).

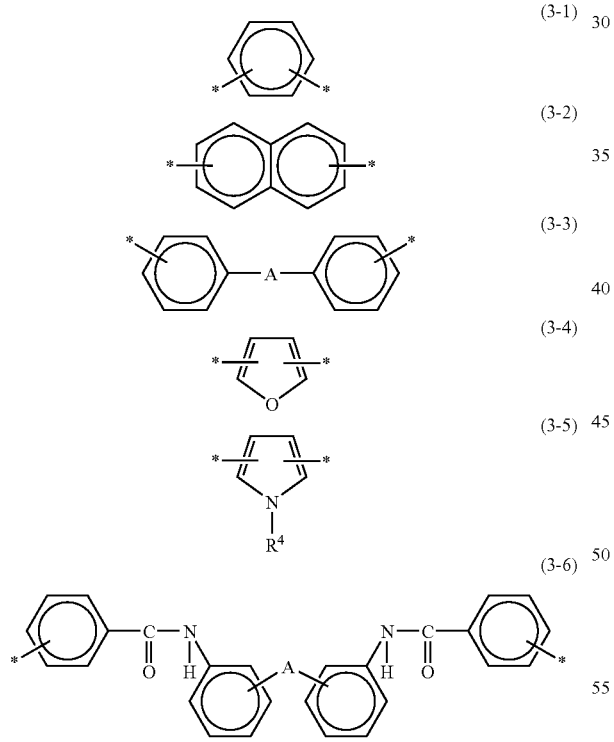

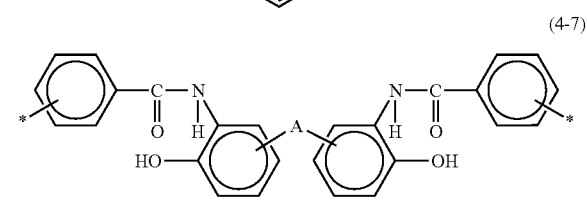

wherein each group is bonded to NH groups at * positions, A is $CH_2$, $C(CH_3)_2$, O, S, $SO_2$, CO, NHCO, $C(CF_3)_2$ or a single bond, and $R^4$ is a hydrogen atom, an alkyl group, an alkylester group or a halogen atom.

As represented by the formula (2), the $R^1$ is not bonded to the X, or one or two of the $R^1$s are bonded to the X. In this regard, it is to be noted that even in the case where one or two of the R's are bonded to the X, each $R^1$ is omitted in each of the formulas (3-1) to (3-6).

wherein each group is bonded to C=O groups at * positions, A is CH$_2$, C(CH$_3$)$_2$, O, S, SO$_2$, CO, NHCO, C(CF$_3$)$_2$ or a single bond, and R$^5$ is a hydrogen atom, an alkyl group, an alkylester group or a halogen atom.

As represented by the formula (2), the R$^2$ is not bonded to the Y, or one to four of the R$^2$s are bonded to the Y. In this regard, it is to be noted that even in the case where one to four of the R$^2$s are bonded to the Y, each R$^2$ is omitted in each of the formulas (4-1) to (4-7).

As described above, the R$^2$ is the hydroxyl group, the carboxyl group, the O—R$^3$, the COO—R$^3$, or the CO—R$^{10}$. In the case where a plurality of the R$^2$s are bonded to the Y in one repeating unit, the R$^2$s are the same or different.

The R$^3$ is an organic group having a carbon number of 1 to 15. Concrete examples of the R$^3$ include a formyl group, a methyl group, an ethyl group, a propyl group, an isopropyl group, a tertiary butyl group, a tertiary butoxycarbonyl group, a phenyl group, a benzyl group, a tetrahydrofuranyl group, a tetrahydro pyranyl group, and the like.

In this regard, it is to be noted that in all repeating units of the formula (2), when each R$^1$ is not the hydroxyl group, at least one of the R$^2$s is the carboxyl group, or when each R$^2$ is not the carboxyl group, at least one of the R$^1$s is the hydroxyl group. The above R$^2$s are used for adjusting solubility of the polyamide based resin in an alkaline aqueous solution.

Further, as described above, the R$^{10}$ is the group having the cyclic chemical structure containing nitrogen atoms. Concrete examples of the R$^{10}$ include a (1H-tetrazol-5-yl)amino group (that is, the chemical structure represented by the formula (1-1)), a 1-(1H-tetrazol-5-yl)methyl-amino group, a 3-(1H-tetrazol-5-yl)benz-amino group (that is, the chemical structure represented by the formula (1-2)), and the like. In this case, the substituent group having the cyclic chemical structure containing nitrogen atoms is bonded to the branch of the main chain in each molecule included in the polyamide based resin (alkali solubility resin).

The above R$^{10}$s are used for improving adhesiveness of the cured film to a metal wiring (especially, a copper wiring).

Among these groups, the Y is especially preferably selected from the formula (4-1), the formula (4-2) and the formula (4-3), and two or more of the groups selected may be used in combination. This makes it possible to especially improve workability of a patterning of the photosensitive resin composition, a physical property of a cured film which is obtained by curing the film.

Further, polyamide based resin including molecules each represented by the following formula (5) may be used as base resin of the alkali solubility resin. This makes it possible to further improve storage stability of the photosensitive resin composition.

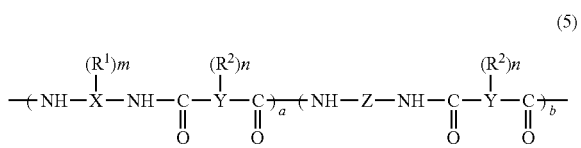

(5)

wherein X is a group having a cyclic chemical structure; R$^1$ is a hydroxyl group, O—R$^3$, an alkyl group, an acyloxy group or a cycloalkyl group; m is an integral number of 0 to 2; and X, R$^1$ and m are the same or different in each repeating unit, respectively;

wherein Y is a group having a cyclic chemical structure; R$^2$ is a hydroxyl group, a carboxyl group, O—R$^3$, COO—R$^3$, CO—R$^{10}$; n is an integral number of 0 to 4; and Y, R$^2$ and n are the same or different in each repeating unit, respectively;

wherein a carbon number of R$^3$ is in the range of 1 to 15; and R$^{10}$ is a group having a cyclic chemical structure containing nitrogen atoms;

wherein in all repeating units, when each R$^1$ is not the hydroxyl group, at least one of R$^2$s is the carboxyl group, or when each R$^2$ is not the carboxyl group, at least one of R's is the hydroxyl group;

wherein a and b represents mole percent (mol %), a+b=100, a is in the range of 60 to 95 mol %, and b is in the range of 5 to 40 mol %; and wherein Z is a siloxane structure represented by the following formula (6).

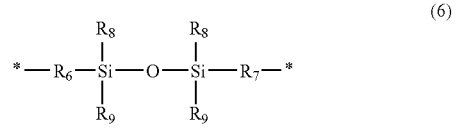

(6)

wherein the siloxane structure is bonded to NH groups at * positions, and R$^6$ to R$^9$ are organic groups and the same or different.

The polyamide based resin including the molecules each represented by the formula (5) is preferably used as the alkali solubility resin. Specifically, it is preferred that such an alkali solubility resin is a copolymer including repeating units enclosed within parentheses to which "a" is applied and repeating units enclosed within parentheses to which "b" is applied, as represented by the formula (5).

Each repeating unit "a" is derived from a compound which may be obtained by reacting a compound selected from the groups comprising diamine, bis(aminophenol) and diaminophenol each having a chemical structure of the above mentioned X, and a compound selected from the groups comprising tetracarboxylic acid anhydride, trimellitic acid anhydride, dicarboxylic acid, dicarboxylic acid dichloride, a dicarboxylic acid derivative, hydroxydicarboxylic acid and a hydroxydicarboxylic acid derivative each having a chemical structure of the above mentioned Y with each other.

On the other hand, each repeating unit "b" is derived from a compound which may be obtained by reacting silicone diamine having the chemical structure of the above mentioned Z (that is, the formula (6)), and a compound selected from the groups comprising tetracarboxylic acid anhydride, trimellitic acid anhydride, dicarboxylic acid, dicarboxylic acid dichloride, a dicarboxylic acid derivative, hydroxydicarboxylic acid and a hydroxydicarboxylic acid derivative each having the chemical structure of the above mentioned Y with each other.

By using the polyamide based resin including such molecules as the base resin of the alkali solubility resin, it is possible to especially improve the storage stability of the photosensitive resin composition.

Concrete examples of the Z include chemical structures represented by the following formula (7).

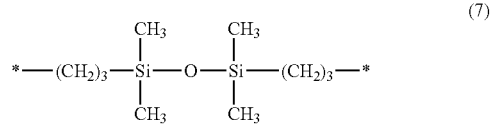

(7)

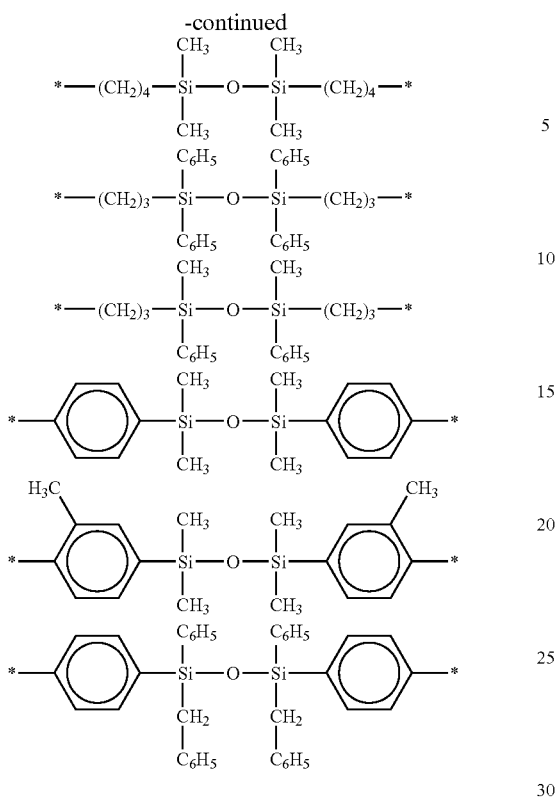

wherein each chemical structure is bonded to NH groups at * positions.

In the case where the polyamide based resin including molecules each represented by the general formula (5) having the chemical structure of the Z is used as the alkali solubility resin, a cured film, which is obtained by curing a film made of the photosensitive resin composition, can exhibit especially excellent adhesiveness to a substrate such as a silicon wafer.

In this case, a ratio of each of the "a" and the "b" is not particularly limited to a specific value, but the ratio of the "b" is preferably 40 mol % or less, and more preferably 30 mol % or less. By setting the ratio of the "b" within the above range, the film can have excellent solubility at an irradiated portion thereof and good pattern workability. Further, the film cured (insulating film 6) can maintain excellent adhesiveness to the metal wiring (conductor portion 4).

In each of the molecules included in such an alkali solubility resin, the organic group having the at least one unsaturated group is bonded to the one end of the main chain. This makes it possible to improve a mechanical property such as elongation percentage of the cured film.

Examples of such an organic group include an aliphatic group having at least one alkenyl group(s) or alkynyl group (s), an acid anhydride group containing a cyclic chemical structure, and the like. This makes it possible to improve the mechanical property of the cured film.

Examples of the organic group include a group having alkenyl group(s) as represented by the following formula (8), a group having alkynyl group(s) as represented by the following formula (9), and or the like.

(8)

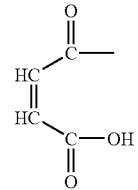
(8-1)

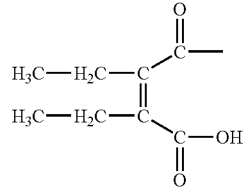
(8-2)

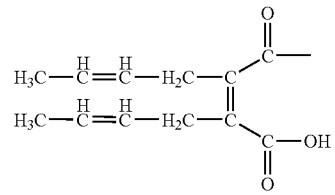
(8-3)

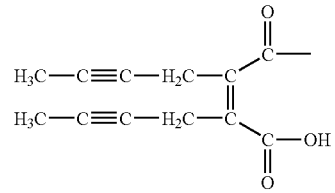
(8-4)

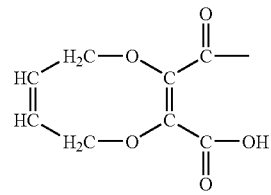
(8-5)

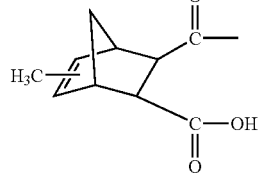
(8-6)

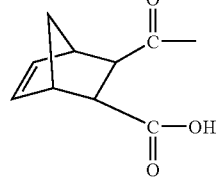
(8-7)

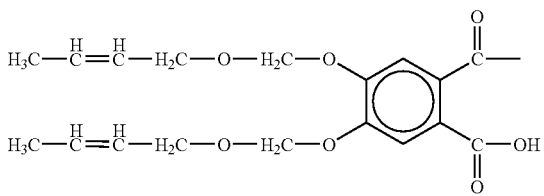
(8-8)

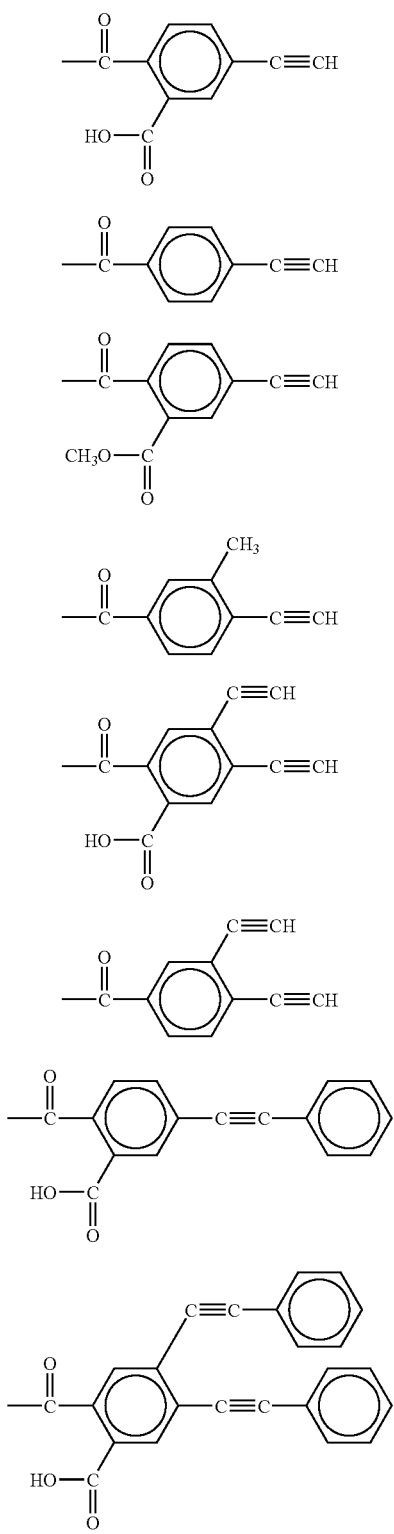

Among these groups, the group having the alkenyl group or alkynyl group is especially preferably selected from the formula (8-1), the formula (8-7) and the formula (9-1) each transformed by the reaction, and two or more of the groups selected may be used in combination. This makes it possible to especially improve the mechanical property of the cured film.

Further, in each of the molecules included in the alkali solubility resin, the substituent group having the cyclic chemical structure containing nitrogen atoms is bonded to at least one of the other end of the main chain and the branch thereof. This makes it possible to improve adhesiveness of the cured film to the metal wiring (especially, copper wiring) and the like.

Examples of the substituent group having the cyclic chemical structure containing nitrogen atoms include a 1-(5-1H-tetrazoyl) methyl-amino group, a 3-(1H-pyrazoyl)amino group, a 4-(1H-pyrazoyl)amino group, a 5-(1H-pyrazoyl) amino group, a 1-(3-1H-pyrazoyl)methyl-amino group, a 1-(4-1H-pyrazoyl)methyl-amino group, a 1-(5-1H-pyrazoyl) methyl-amino group, a (1H-tetrazol-5-yl)amino group (that is, the chemical structure represented by the formula (1-1)), a 1-(1H-tetrazol-5-yl)methyl-amino group, a 3-(1H-tetrazol-5-yl)benz-amino group (that is, the chemical structure represented by the formula (1-2)), and the like.

Among these groups, it is preferred that the substituent group has at least one of the chemical structures represented by the formulas (1-1) and (1-2). This makes it possible to especially improve the adhesiveness of the cured film to the metal wiring made of copper and copper alloy.

As described above, in the present invention, the alkali solubility resin includes the molecules each containing the organic group bonded to the one end of the main chain and having the at least one unsaturated group, and the substituent group bonded to at least one of the other end of the main chain and the branch thereof and having the cyclic chemical structure containing nitrogen atoms.

This makes it possible to improve the mechanical property of the cured film and to enhance the adhesiveness of the cured film to the metal wiring. It is supposed that these facts are because of the following reason.

Since each of the molecules included in the alkali solubility resin contains the organic group having the at least one unsaturated group at the one end of the main chain, when the cured film is formed by curing the film made of the photosensitive resin composition, a reaction occurs between the molecules. As a result, the mechanical property such as elongation percentage of the cured film can be improved.

Further, since each of the molecules included in the alkali solubility resin contains has the substituent group having the cyclic chemical structure containing nitrogen atoms at the other end of the main chain or the branch thereof, when the cured film is formed by curing the film made of the photosensitive resin composition, a reaction occurs between the cyclic chemical structure containing nitrogen atoms and copper or copper alloy constituting the metal wiring. As a result, the cured film can enhance the adhesiveness to the metal wiring.

On the other hand, in the case where a cyclic compound containing nitrogen atoms is merely added to a photosensitive resin composition, namely, an alkali solubility resin including molecules each having no cyclic chemical structure containing nitrogen atoms is used, such molecules each having no cyclic chemical structure containing nitrogen atoms themselves cannot react with copper and copper alloy constituting a metal wiring.

Therefore, it is difficult that a cured film obtained by curing a film composed of the photosensitive resin composition has sufficient adhesiveness to the metal wiring.

In other words, in this case, in order to obtain sufficient adhesiveness between the cured film and the metal wiring, it is important that both a reaction between the cyclic compound containing nitrogen atoms and the copper and copper alloy constituting the metal wiring, and a reaction between the cyclic compound containing nitrogen atoms and the molecules included in the alkali solubility resin are carried out sufficiently.

However, generally, in the case where the cyclic compound containing nitrogen atoms is merely added to the photosensitive resin composition, the reaction between the cyclic compound containing nitrogen atoms and the molecules included in the alkali solubility resin cannot be carried out sufficiently.

In the present invention, the alkali solubility resin includes the molecules each containing the substituent group bonded to at least one of the other end of the main chain and the branch thereof and having the cyclic chemical structure containing nitrogen atoms (in other words, the alkali solubility resin includes the cyclic compound containing nitrogen atoms in a molecule thereof).

Therefore, the cyclic chemical structure containing nitrogen atoms can react with the copper and copper alloy constituting the metal wiring, so that the cured film can have excellent adhesiveness to the metal wiring.

As described above, the alkali solubility resin includes the molecules each containing the organic group bonded to the one end of the main chain and having the at least one unsaturated group, and the substituent group bonded to at least one of the other end of the main chain and the branch thereof and having the cyclic chemical structure containing nitrogen atoms.

Examples of such an alkali solubility resin include the following types of alkali solubility resins.

A first type of an alkali solubility resin includes molecules each composed of a main chain having one end and the other end opposite to the one end, an organic group bonded to the one end thereof, the organic group having the at least one unsaturated group, and a substituent group bonded to the other end of the main chain, the substituent group having the cyclic chemical structure containing nitrogen atoms.

A second type of an alkali solubility resin includes molecules each composed of a main chain having one end and the other end opposite to the one end, an organic group bonded to the one end thereof, the organic group having the at least one unsaturated group, and a substituent group bonded to a branch of the main chain, the substituent group having the cyclic chemical structure containing nitrogen atoms. In this regard, in this second type of the alkali solubility resin, the other substituent group may be bonded to the other end of the main chain.

A third type of an alkali solubility resin includes molecules each composed of a main chain having one end and the other end opposite to the one end, an organic group bonded to the one end thereof, the organic group having the at least one unsaturated group, and substituent groups bonded to both the other end of the main chain and a branch thereof, the substituent groups each having the cyclic chemical structure containing nitrogen atoms.

In this regard, it is to be noted that within a scope of the object of the present invention, the photosensitive resin composition may contain an alkali solubility resin including molecules each composed of a main chain having both ends, substituent groups bonded to at the both ends, the substituent groups each having the cyclic chemical structure containing nitrogen atoms, and/or an alkali solubility resin including molecules each composed of a main chain having both ends, organic groups bonded to the both ends thereof, the organic groups each having at least one unsaturated group.

(Photosensitive Agent)

Next, the photosensitive agent will be described. The photosensitive resin composition includes the photosensitive agent. In the case where the photosensitive resin composition contains the photosensitive agent, when an ultraviolet ray or the like is irradiated onto a film made of the photosensitive resin composition, a chemical change of each molecule included in the alkali solubility resin occurs within irradiated portions of the film easily.

As a result, by irradiating the ultraviolet ray or the like onto the film, solubility of each chemically changed molecule in an alkali aqueous solution is increased. Therefore, a difference of solubility between the irradiated portions and non-irradiated portions of the film is generated.

Examples of the photosensitive agent include: an ester compound of a phenolic compound and 1,2-naphthoquinone-2-diazide-5-sulfonic acid; an ester compound of a phenolic compound and 1,2-naphthoquinone-2-diazide-4-sulfonic acid; and the like.

Specifically, examples of the photosensitive agent include ester compounds represented by the following formulas (10) to (14), and two or more of the ester compounds may be used in combination. In the regard, it is to be noted that in the formulas (10) to (14), Q is a hydrogen atom, a 1,2-naphthoquinone-2-diazide-5-sulfonyl group, or a 1,2-naphthoquinone-2-diazide-4-sulfonyl group.

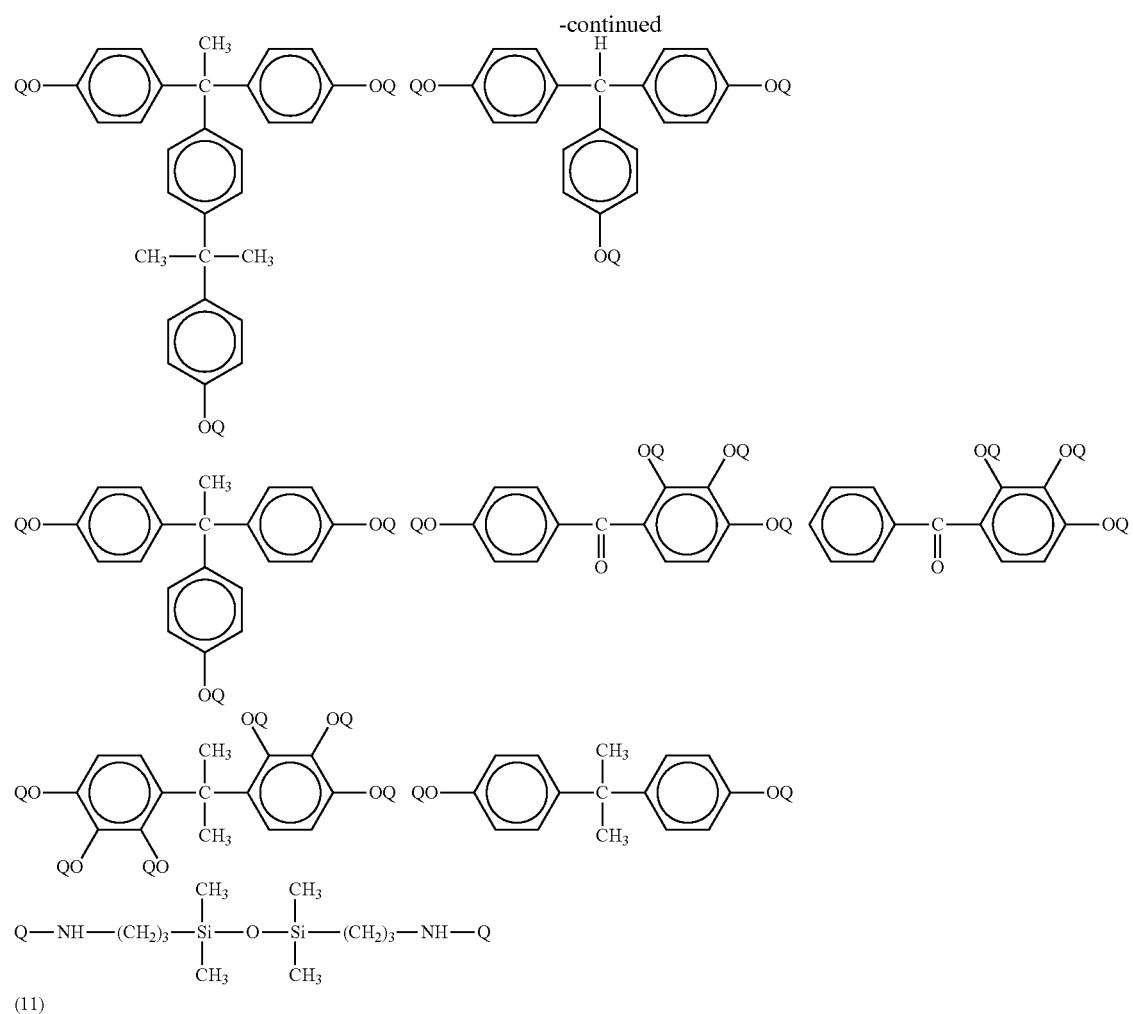
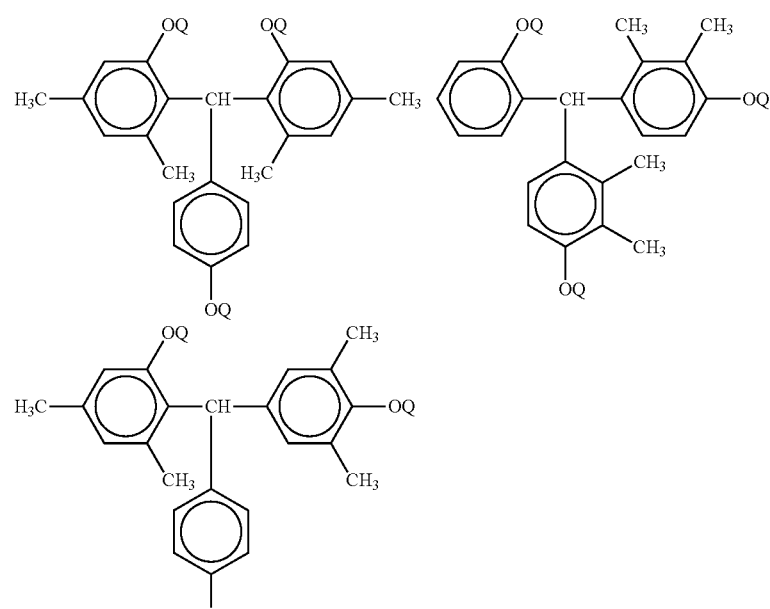

An amount of the photosensitive agent is preferably in the range of 1 to 50 wt %, and more preferably in the range of 5 to 30 wt % with respect to a total weight of the photosensitive resin composition. By setting the amount of the photosensitive agent contained in the photosensitive resin composition within the above range, the film made of the photosensitive resin composition can have especially excellent sensitivity.

It is preferred that the photosensitive resin composition further includes a compound having phenolic hydroxyl groups. This makes it possible to further improve sensitivity of the film. In addition, when the film is developed after irradiation, it can be patterned at high resolution without occurrence of a developing residue (i.e., scum).

Examples of the compound having phenolic hydroxyl groups include compounds represented by the following formulas (15) to (21).

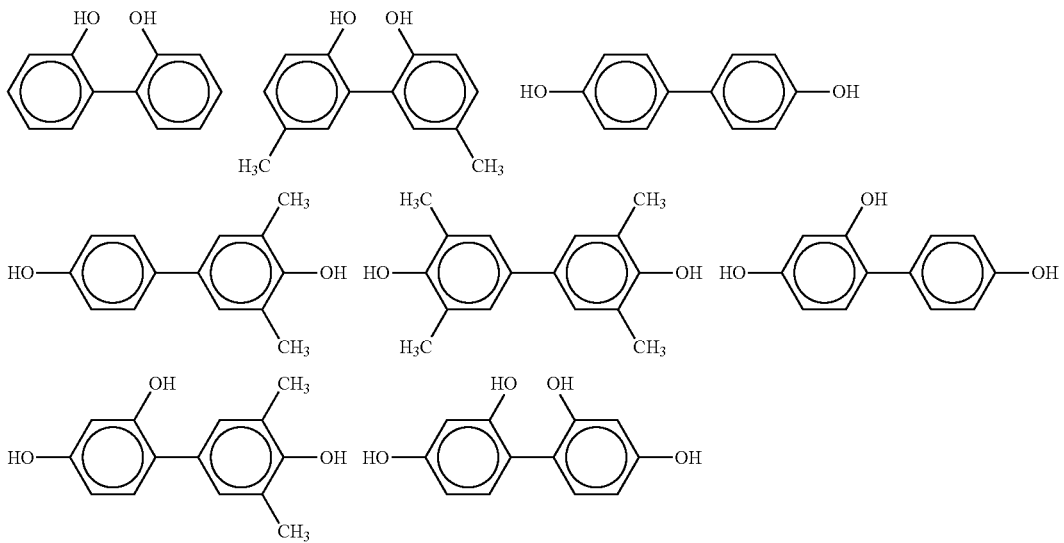

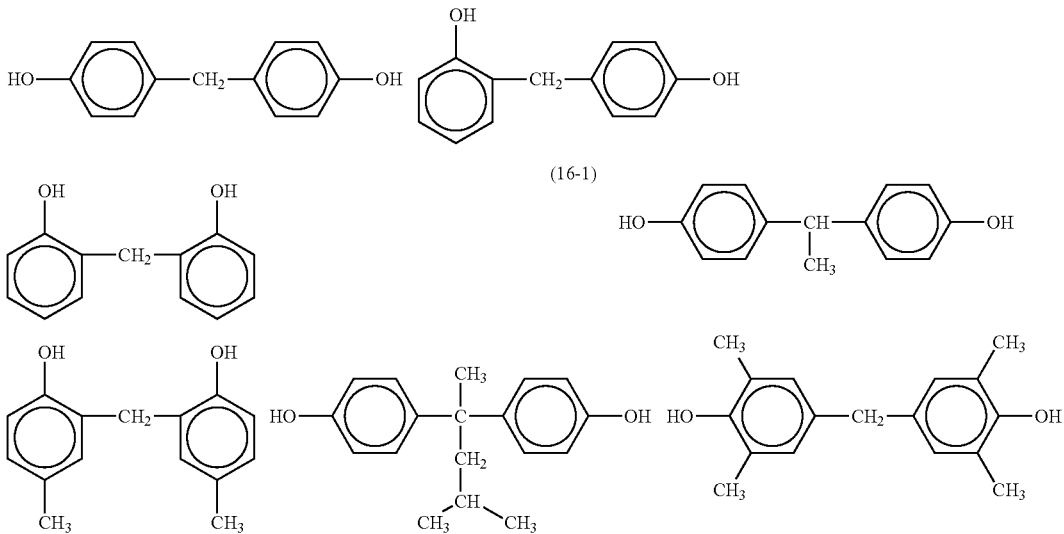

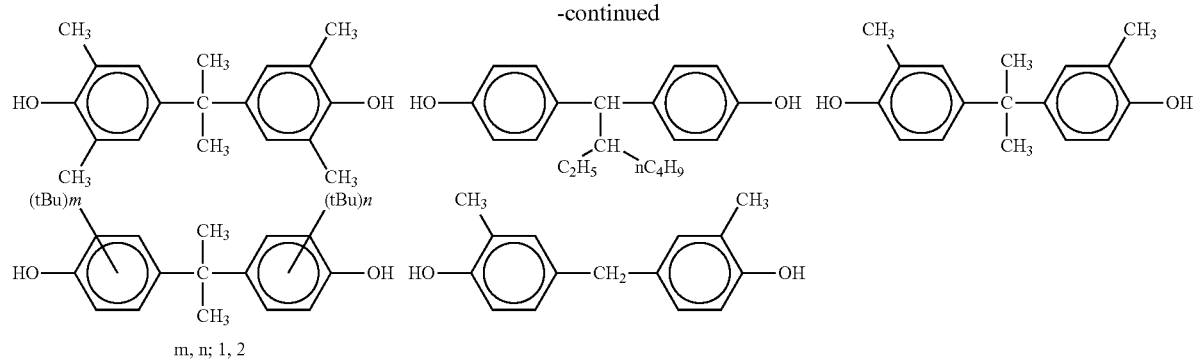
(17)
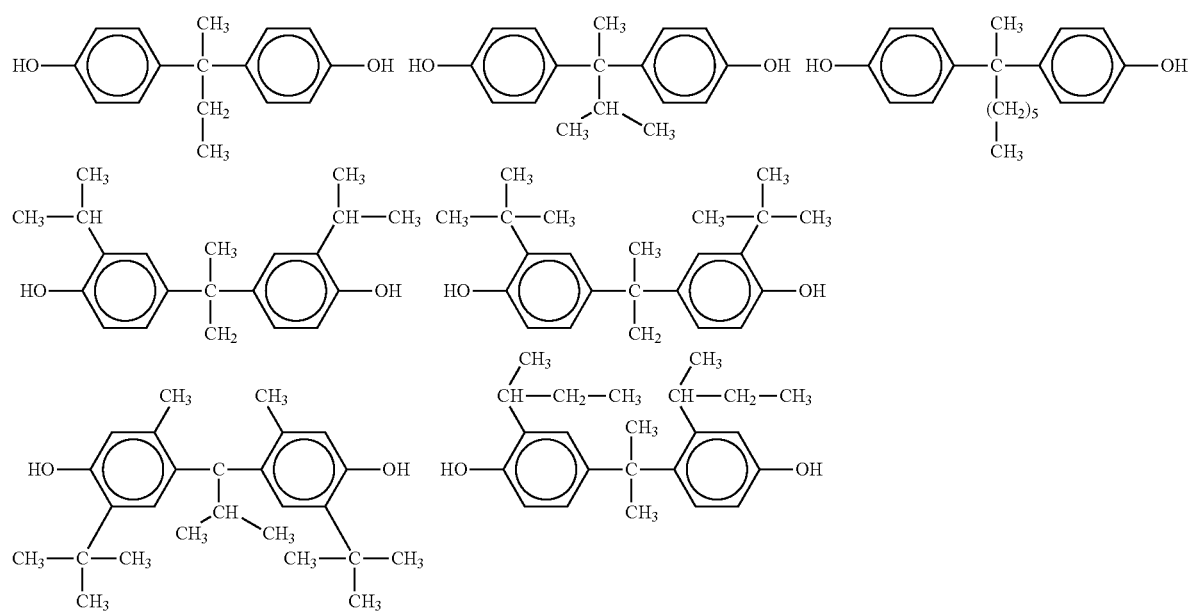
(18)
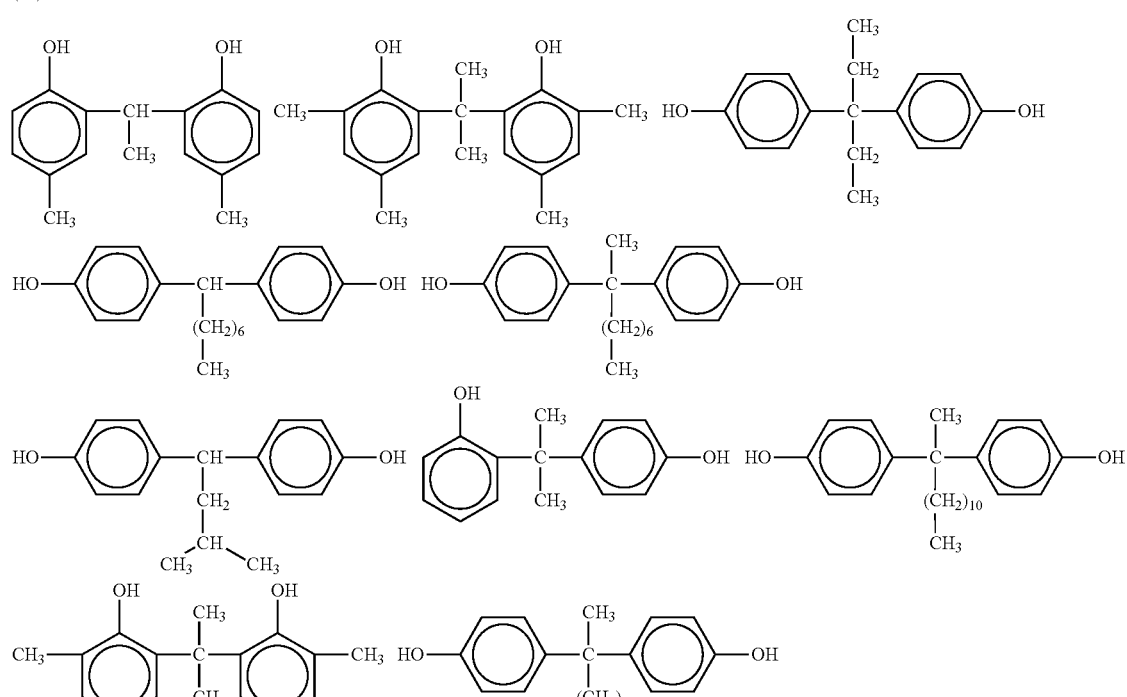

Among these compounds, the compound having phenolic hydroxyl groups is preferably selected from the formula (15-1), the formula (16-1) and the formula (20-1), and two or more of the compounds selected may be used in combination. This makes it possible to especially improve the sensitivity of the film.

An amount of the compound having phenolic hydroxyl groups is not particularly limited to a specific value, but is preferably in the range of 1 to 30 parts by weight, and more preferably in the range of 1 to 20 parts by weight with respect to 100 parts by weight of the alkali solubility resin.

By setting the amount of the compound having phenolic hydroxyl groups contained in the photosensitive resin composition within the above range, it is possible to especially improve the sensitivity of the film.

Further, the photosensitive resin composition may, if needed, include an addition agent such as a leveling agent, a coupling agent (e.g., a silane coupling agent or a titanate based coupling agent) or a reactant of them, and the like.

The photosensitive resin composition of the present invention is preferably used in the form of varnish by dissolving the above materials into a solvent.

Examples of the solvent include N-methyl-2-pyrrolidone, γ-butyrolactone, N,N'-dimethyl acetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxy propionate, and these solvents may be used singly or in combination.

Next, the insulating film, the protective film, and the electronic equipment according to the present invention will be described.

For example, the insulating film and protective film of the present invention can be obtained through the following steps.

<Application Step>

First, the above described photosensitive resin composition is applied onto a support member such as a silicon wafer, a ceramics substrate or an aluminum substrate to obtain a coating film.

In the case where the photosensitive resin composition is applied onto a semiconductor device, an application amount thereof is set to a specific value so that the coating film after being cured (that is, a cured film) can have a thickness of about 0.1 to 30 μm.

If the thickness of the coating film is less than the above lower limit value, there is a case that it is difficult that the cured film can exhibit a function as the insulating film or protective film (surface film) sufficiently, whereas if the thickness of the coating film exceeds the above upper limit value, there is a case that it is difficult that the coating film can be processed so as to have a refined pattern.

Examples of an application method include a spin application method using a spinner, a spray application method using a spray coater, a dipping method, a printing method, a roll coating method, and the like.

<Irradiation Step>

Next, the coating film is pre-baked at a temperature of about 60 to 130° C. so that it is dried to obtain a dry film (dried coating film), and then an actinic ray is irradiated onto the dry film in a predetermined pattern.

As the actinic ray, an X-ray, an electron ray, an ultraviolet ray, a visible ray or the like can be used, but an actinic ray having a wavelength of about 200 to 500 nm is preferably used.

<Development Step>

Next, portions of the dry film, on which the actinic ray are irradiated, are dissolved and removed using a developing solution to obtain a relief pattern.

As the developing solution, an aqueous solution containing inorganic alkalis such as sodium hydroxide, potassium hydroxide, sodium carbonate, sodium silicate, sodium meta-silicate and ammonia water; an aqueous solution containing organic alkalis such as primary amines (e.g., ethyl amine and n-propyl amine), secondary amines (e.g., diethyl amine and di-n-propyl amine), tertiary amines (e.g., triethyl amine and methyl diethyl amine), alcohol amines (e.g., dimethyl ethanol amine and triethanol amine), and quaternary ammonium salts (e.g., tetramethyl ammonium hydroxide and tetraethyl ammonium hydroxide); an aqueous solution in which a water-soluble organic solvent such as alcohol (e.g., methanol or ethanol) or a surface active agent is added to the above aqueous solution in an adequate amount; and the like can be preferably used.

As a developing method, a spray method, a puddle method, a dipping method, an ultrasonic sound method or the like can be used.

<Rinse Step>

Next, the relief pattern formed by the development is rinsed or washed. As a rinse solution, a distilled water or the like can be used.

<Heat Step>

Next, the relief pattern is subjected to a heat treatment so that ring closure structures such as oxazole rings and imide rings are formed within the molecules included in the alkali solubility resin to thereby obtain a final pattern (that is, the insulating film or protective film) having an abundance of heat resistance.

In this heat step, it is possible to convert the above described photosensitive resin composition into a cured product thereof. A heat treatment temperature is not particularly limited to a specific value, but is preferably in the range of 150 to 400° C., and more preferably in the range of 200 to 300° C.

The above described cured product of the photosensitive resin composition obtained through the above steps can be used as an insulating film for a semiconductor element, an interlayer insulating film for a multilayer circuit board, a cover coat film for a flexible copper-clad plate, a solder resist film, a liquid crystal orientation film, an interlayer insulating film for elements provided in a display device, or the like, depending on kinds of support members on which the cured product is formed.

A thickness of the insulating film or protective film to be obtained is not particularly limited to a specific value, but is preferably in the range of 0.1 to 50 μm, and more preferably in the range of 1 to 30 μm.

By setting the thickness of the insulating film or protective film to be obtained within the above range, the coating film can significantly exhibit workability, and the insulating film or protective film obtained can have a good membrane physical property.

Specifically, in the case where the cured product of the above described photosensitive resin composition is used for manufacturing semiconductor devices, examples of the cured product (cured film) include a passivation film to be provided on a semiconductor element, a buffer coating film to be provided on a passivation film formed on a semiconductor element, an interlayer insulating film to be provided on a circuit formed on a semiconductor element, and the like.

Further, in the case where the cured product of the above described photosensitive resin composition is used for manufacturing display devices, examples of the cured product (cured film) include an interlayer insulating film for TFT elements, a flattening film for TFT elements, a flattening film for a color filter, a protrusion for an MVA type liquid crystal display device, a partition for cathodes of organic electroluminescent elements, and the like.

Each part can be obtained by forming a film, which is composed of the cured product of the photosensitive resin composition and has a predetermined pattern, on a substrate provided with display elements or color filter elements according to the same method as described in the semiconductor use.

In this regard, although it is required that the film for display devices, especially, the interlayer insulating film or the flattening film has high transparency, such a film having high transparency can be obtained by irradiating the actinic ray onto the relief pattern once again before the relief pattern is cured.

This process can be carried out by introducing a subsequent irradiation step after the irradiation step. This makes it possible to obtain a film having preferable utility to the display devices.

The electronic equipment of the present invention is provided with the protective film and/or the insulating film. Specifically, examples of the electronic equipment include a semiconductor device, a liquid crystal display device, an organic electroluminescent device, a multilayer circuit board, and the like.

EXAMPLES

Hereinbelow, the present invention will be described in detail based on the following Examples and Comparative Examples, but the present invention is not limited thereto.

Example 1

1. Synthesis of Polyamide Resin (A-1)

First, 80.7 g (170.3 mmol) of a mixture of dicarboxylic acid ester derivatives obtained by reacting 35.2 g (136.3 mmol) of diphenylether-4,4'-dicarboxylic acid and 5.7 g (34.5 mmol) of isophthalic acid with 46.0 g (340.8 mmol) of 1-hydroxy-1,2,3-benzotriazole, 41.6 g (179.3 mmol) of 4,4'-oxybis(2-aminophenol), and 3.3 g (31.4 mmol) of 5-amino-1H-tetrazole 1-hydrate were put into a four-necked separable flask equipped with a thermometer, a stirrer, a raw material input port and a dry nitrogen gas-introducing tube.

Next, 363.5 g of N-methyl-2-pyrrolidone (NMP) was added to the above materials so that they were dissolved into the NMP to obtain a liquid solution, and then the liquid solution was stirred at room temperature for 2 hours.

Thereafter, the liquid solution was heated at 75° C. for 12 hours using an oil bath so that the dicarboxylic acid ester derivatives, the 4,4'-oxybis(2-aminophenol) and the 5-amino-1H-tetrazole 1-hydrate were reacted with each other.

Next, 11.5 g of NMP, in which 2.3 g (13.4 mmol) of 5-ethynyl-isobenzofuran-1,3-dione was dissolved, was added to the liquid solution, and then the liquid solution was stirred for 2 hours so that the reaction was completed to obtain a reaction mixture.

The reaction mixture was filtered, and then put into a liquid solution containing water and methanol in a volume ratio of 3:1 so that a precipitate was produced in the liquid solution. Thereafter, the produced precipitate was filtered and washed using water sufficiently, and then dried under a vacuum condition to thereby obtain a polyamide resin (A-1).

In this regard, it is to be noted that an amount of cyclic chemical structures containing nitrogen atoms contained in the obtained polyamide resin (A-1) was 3.2 wt %.

2. Synthesis of Photosensitive Agent 51 g (120 mmol) of 1-[1-(4-hydroxyphenyl)isopropyl]-4-[1,1-bis(4-hydroxyphenyl)ethyl]benzene and 72.5 g (270 mmol) of 1,2-naphthoquinonediazide-4-sulfonic acid chloride were dissolved into 450 mL of tetrahydrofuran to obtain a liquid solution, and then 28.3 g (280 mmol) of triethyl amine was dropped into the liquid solution.

Next, the 1-[1-(4-hydroxy-phenyl)isopropyl]-4-[1,1-bis(4-hydroxy-phenyl)ethyl]benzene and the 1,2-naphthoquinone diazide-4-sulfonic acid chloride were reacted with each other at room temperature for 20 hours. At this time, triethyl amine hydrochloride was deposited in the liquid solution.

Thereafter, the deposited triethyl amine hydrochloride was filtered and removed from the liquid solution, and then the liquid solution was put into 10 L of an ion exchanged water to obtain a precipitate in the ion exchanged water. This precipitate was collected, and then was dried at room temperature for 48 hours to thereby obtain a photosensitive diazoquinone (B-1) as the photosensitive agent.

3. Manufacture of Photosensitive Resin Composition 100 g of the synthesized polyamide resin (A-1) and 17 g of the synthesized photosensitive diazoquinone (B-1) were dissolved into 300 g of γ-butyrolactone (GBL), and then filtered using a filter having a pore size of 0.2 μm and made of fluororesin to thereby obtain a positive type photosensitive resin composition.

Example 2

A positive type photosensitive resin composition was obtained in the same manner as in the Example 1 except that the following polyamide resin (A-2) was used instead of the polyamide resin (A-1).

Synthesis of Polyamide Resin (A-2)

6.5 g (34.1 mmol) of trimellitic acid anhydride and 4.3 g (41.3 mmol) of 5-amino-1H-tetrazole 1-hydrate were put into a four-necked separable flask equipped with a thermometer, a stirrer, a raw material input port and a dry nitrogen gas-introducing tube.

Thereafter, 37.8 g of NMP was added to the above materials so that they were dissolved into the NMP to obtain a liquid solution, and then the liquid solution was stirred at 20° C. or less overnight so that the trimellitic acid anhydride and the 5-amino-1H-tetrazole 1-hydrate were reacted with each other to obtain an amide compound.

Next, 31.6 g (136.2 mmol) of diphenylether-4,4'-dicarboxylic acid and 46.0 g (340.6 mmol) of 1-hydroxy-1,2,3-benzotriazole were added to the liquid solution so that the 1-hydroxy-1,2,3-benzotriazole was reacted with the amide compound and the diphenylether-4,4'-dicarboxylic acid to obtain 76.0 g (170.3 mmol) of a mixture of dicarboxylic acid ester derivatives.

Next, 41.6 g (179.0 mmol) of 4,4'-oxybis(2-aminophenol) was added to the liquid solution, 363.5 g of NMP was further added to the liquid solution so that the 4,4'-oxybis(2-aminophenol) was dissolved into the liquid solution, and then the liquid solution was stirred at room temperature for 2 hours.

Thereafter, the liquid solution was heated at 75° C. for 12 hours using an oil bath so that the dicarboxylic acid ester derivatives and the 4,4'-oxybis(2-aminophenol) were reacted with each other.

Next, 11.5 g of NMP, in which 3.7 g (19.3 mmol) of 5-ethynyl-isobenzofuran-1,3-dione was dissolved, was added to the liquid solution, the liquid solution was stirred for 2 hours so that the reaction was completed, and then the same treatment as the Example 1 was carried out to thereby obtain a polyamide resin (A-2).

In this regard, it is to be noted that an amount of cyclic chemical structures containing nitrogen atoms contained in the obtained polyamide resin (A-2) was 4.5 wt %.

Example 3

A positive type photosensitive resin composition was obtained in the same manner as in the Example 1 except that the following polyamide resin (A-3) was used instead of the polyamide resin (A-1).

Synthesis of Polyamide Resin (A-3)

6.6 g (34.4 mmol) of trimellitic acid anhydride and 4.3 g (41.7 mmol) of 5-amino-1H-tetrazole 1-hydrate were put into a four-necked separable flask equipped with a thermometer, a stirrer, a raw material input port and a dry nitrogen gas-introducing tube.

Thereafter, 37.8 g of NMP was added to the above materials so that they were dissolved into the NMP to obtain a liquid solution, and then the liquid solution was stirred at 20° C. or less overnight so that the trimellitic acid anhydride and the 5-amino-1H-tetrazole 1-hydrate were reacted with each other to obtain an amide compound.

Next, 35.2 g (136.2 mmol) of diphenylether-4,4'-dicarboxylic acid and 46.0 g (340.6 mmol) of 1-hydroxy-1,2,3-benzotriazole were added to the liquid solution so that the 1-hydroxy-1,2,3-benzotriazole was reacted with the amide compound and the diphenylether-4,4'-dicarboxylic acid to obtain 76.7 g (170.3 mmol) of a mixture of dicarboxylic acid ester derivatives.

Next, 35.2 g (144.6 mmol) of 4,4'-oxybis(2-aminophenol) and 3.2 g (31.5 mmol) of 5-amino-1H-tetrazole 1-hydrate were added to the liquid solution, and then the liquid solution was stirred at room temperature for 2 hours.

Thereafter, the liquid solution was heated at 75° C. for 12 hours using an oil bath so that the dicarboxylic acid ester derivatives, the 4,4'-oxybis(2-aminophenol) and the 5-amino-1H-tetrazole 1-hydrate were reacted with each other.

Next, 11.5 g of NMP, in which 3.7 g (19.3 mmol) of 5-ethynyl-isobenzofuran-1,3-dione was dissolved, was added to the liquid solution, the liquid solution was stirred for 2 hours so that the reaction was completed, and then the same treatment as the Example 1 was carried out to thereby obtain a polyamide resin (A-3).

In this regard, it is to be noted that an amount of cyclic chemical structures containing nitrogen atoms contained in the obtained polyamide resin (A-3) was 4.8 wt %.

Example 4

A positive type photosensitive resin composition was obtained in the same manner as in the Example 1 except that the following polyamide resin (A-4) was used instead of the polyamide resin (A-1).

Synthesis of Polyamide Resin (A-4)

A polyamide resin (A-4) was obtained in the same manner as in the synthesis of the polyamide resin (A-1) except that 3.2 g (31.0 mmol) of the 5-amino-1H-tetrazole 1-hydrate was changed to 5.0 g (31.0 mmol) of 3-(1H-tetrazole-5-yl)aniline.

In this regard, it is to be noted that an amount of cyclic chemical structures containing nitrogen atoms contained in the obtained polyamide resin (A-4) was 5.6 wt %.

Example 5

A positive type photosensitive resin composition was obtained in the same manner as in the Example 1 except that the following polyamide resin (A-5) was used instead of the polyamide resin (A-1).

Synthesis of Polyamide Resin (A-5)

A polyamide resin (A-5) was obtained in the same manner as in the synthesis of the polyamide resin (A-1) except that 2.3 g (13.4 mmol) of the 5-ethynyl-isobenzofuran-1,3-dione was changed to 2.2 g (13.4 mmol) of 5-norbornene-2,3-dicarboxylic acid anhydride.

In this regard, it is to be noted that an amount of cyclic chemical structures containing nitrogen atoms contained in the obtained polyamide resin (A-5) was 2.5 wt %.

Example 6

A positive type photosensitive resin composition was obtained in the same manner as in the Example 1 except that the following polyamide resin (A-6) was used instead of the polyamide resin (A-1).

Synthesis of Polyamide Resin (A-6)

A polyamide resin (A-6) was obtained in the same manner as in the synthesis of the polyamide resin (A-1) except that 3.2 g (31.0 mmol) of the 5-amino-1H-tetrazole 1-hydrate was changed to 2.6 g (31.0 mmol) of 5-amino-1H-pyrazole.

In this regard, it is to be noted that an amount of cyclic chemical structures containing nitrogen atoms contained in the obtained polyamide resin (A-6) was 3.0 wt %.

Example 7

A positive type photosensitive resin composition was obtained in the same manner as in the Example 1 except that the following polyamide resin (A-7) was used instead of the polyamide resin (A-1).

Synthesis of Polyamide Resin (A-7)

3.29 (16.7 mmol) of trimellitic acid anhydride and 1.7 g (16.7 mmol) of 5-amino-1H-tetrazole 1-hydrate were put into a four-necked separable flask equipped with a thermometer, a stirrer, a raw material input port and a dry nitrogen gas-introducing tube.

Thereafter, 15.0 g of NMP was added to the above materials so that they were dissolved into the NMP to obtain a liquid solution, and then the liquid solution was stirred at 20° C. or less overnight so that the trimellitic acid anhydride and the 5-amino-1H-tetrazole 1-hydrate were reacted with each other to obtain an amide compound.

Next, 4.5 g (33.4 mmol) of 1-hydroxy-1,2,3-benzotriazole was added to the liquid solution so that it was reacted with the amide compound to obtain 16.7 mmol of a dicarboxylic acid ester derivative.

Thereafter, 46.7 g (150.5 mmol) of 4,4'-oxydiphthalic acid anhydride was added to the liquid solution together with 297.0 g of NMP, and then the liquid solution was stirred at room temperature for 10 minutes.

In addition, 23.9 g (85.3 mmol) of 3,3'-diamino-4,4'-dihydroxydiphenyl sulfone, 19.8 g (85.3 mmol) of 4,4'-oxybis(2-aminophenol) and 50.0 g of NMP were added to the liquid solution so that the 3,3'-diamino-4,4'-dihydroxydiphenyl sulfone and the 4,4'-oxybis(2-aminophenol) were dissolved into the liquid solution to obtain a mixture solution.

Thereafter, the mixture solution was stirred and heated at 140° C. for 2.5 hours using an oil bath so that the dicarboxylic acid ester derivative, the 4,4'-oxydiphthalic acid, the 3,3'-diamino-4,4'-dihydroxydiphenyl sulfone and the 4,4'-oxybis (2-aminophenol) were reacted with each other.

After the mixture solution was cooled up to 80° C., 2.9 g (17.1 mmol) of 5-ethynyl-isobenzofuran-1,3-dione was added to the mixture solution together with 30 g of NMP, and then the mixture solution was stirred at 80° C. for 2 hours so that the reaction was completed to thereby obtain a polyamide resin (A-7).

In this regard, it is to be noted that an amount of cyclic chemical structures containing nitrogen atoms contained in the obtained polyamide resin (A-7) was 1.7 wt %.

Example 8

A positive type photosensitive resin composition was obtained in the same manner as in the Example 1 except that the following polyamide resin (A-8) was used instead of the polyamide resin (A-1).

Synthesis of Polyamide Resin (A-8)

A polyamide resin (A-8) was obtained in the same manner as in the synthesis of the polyamide resin (A-1) except that 41.6 g (179.0 mmol) of the 4,4'-oxybis(2-aminophenol) was changed to 0.2 g (179.0 mmol) of 3,3'-dihydroxy-4,4'-diphenyl sulfone.

In this regard, it is to be noted that an amount of cyclic chemical structures containing nitrogen atoms contained in the obtained polyamide resin (A-8) was 3.4 wt %.

Example 9

A positive type photosensitive resin composition was obtained in the same manner as in the Example 1 except that the following polyamide resin (A-9) was used instead of the polyamide resin (A-1).

Synthesis of Polyamide Resin (A-9)

38.3 g (77.8 mmol) of a dicarboxylic acid ester derivative obtained by reacting 17.8 g (77.8 mmol) of diphenylether-4,4'-dicarboxylic acid and 23.3 g (155.6 mmol) of 1-hydroxy-1,2,3-benzotriazole with each other, 18.0 g (62.9 mmol) of bis(3-amino-4-hydroxy-2,5-dimethylphenyl)methane, and 1.6 g (18.7 mmol) of 5-amino-1H-tetrazole were put into a four-necked separable flask equipped with a thermometer, a stirrer, a raw material input port and a dry nitrogen gas-introducing tube.

Thereafter, 315.0 g of N-methyl-2-pyrrolidone (NMP) was added to the above materials so that they were dissolved into the NMP to obtain a liquid solution, and then the liquid solution was stirred at room temperature for 2 hours.

Thereafter, the liquid solution was heated at 75° C. for 12 hours using an oil bath so that the dicarboxylic acid ester derivative, the bis(3-amino-4-hydroxy-2,5-dimethylphenyl) methane and the 5-amino-1H-tetrazole were reacted with each other.

Next, 3.2 g (18.7 mmol) of 5-ethynyl-isobenzofuran-1,3-dione was added to the liquid solution, and then the liquid solution was stirred for 2 hours so that the reaction was completed to obtain a reaction mixture.

The reaction mixture was filtered, and then put into a liquid solution containing water and methanol in a volume ratio of 3:1 so that a precipitate was produced in the liquid solution. Thereafter, the produced precipitate was filtered and washed using water sufficiently, and then dried under a vacuum condition to thereby obtain a polyamide resin (A-9).

In this regard, it is to be noted that an amount of cyclic chemical structures containing nitrogen atoms contained in the obtained polyamide resin (A-9) was 2.6 wt %.

Example 10

A positive type photosensitive resin composition was obtained in the same manner as in the Example 9 except that the following polyamide resin (A-10) was used instead of the polyamide resin (A-9).

Synthesis of Polyamide Resin (A-10)

A polyamide resin (A-10) was obtained in the same manner as in the synthesis of the polyamide resin (A-9) except that an additive amount of the 5-amino-1H-tetrazole was changed to 0.6 g (7.5 mmol), and an additive amount of the 5-ethynyl-isobenzofuran-1,3-dione was changed to 5.2 g (30.0 mmol).

In this regard, it is to be noted that an amount of cyclic chemical structures containing nitrogen atoms contained in the obtained polyamide resin (A-10) was 1.0 wt %.

Example 11

A positive type photosensitive resin composition was obtained in the same manner as in the Example 9 except that the following polyamide resin (A-11) was used instead of the polyamide resin (A-9).

Synthesis of Polyamide Resin (A-11)

A polyamide resin (A-11) was obtained in the same manner as in the synthesis of the polyamide resin (A-9) except that an additive amount of the 5-amino-1H-tetrazole was changed to 4.0 g (30.0 mmol), and an additive amount of the 5-ethynyl-isobenzofuran-1,3-dione was changed to 0.5 g (7.5 mmol).

In this regard, it is to be noted that an amount of cyclic chemical structures containing nitrogen atoms contained in the obtained polyamide resin (A-11) was 6.6 wt %.

Comparative Example 1

A positive type photosensitive resin composition was obtained in the same manner as in the Example 1 except that the following polyamide resin (a-1) was used instead of the polyamide resin (A-1).

Synthesis of Polyamide Resin (a-1)

83.9 g (170.3 mmol) of a mixture of dicarboxylic acid ester derivatives obtained by reacting 35.2 g (136.3 mmol) of diphenylether-4,4'-dicarboxylic acid, 5.7 g (34.5 mmol) of isophthalic acid and 46.0 g (340.6 mmol) of 1-hydroxy-1,2,3-benzotriazole with each other, and 41.6 g (179.0 mmol) of 4,4'-oxybis(2-aminophenol) were put into a four-necked separable flask equipped with a thermometer, a stirrer, a raw material input port and a dry nitrogen gas-introducing tube.

Thereafter, 363.5 g of N-methyl-2-pyrrolidone (NMP) was added to the above materials so that they were dissolved into the NMP to obtain a liquid solution, and then the liquid solution was stirred at room temperature for 2 hours.

Thereafter, the liquid solution was heated at 75° C. for 12 hours using an oil bath so that the dicarboxylic acid ester derivatives and the 4,4'-oxybis(2-aminophenol) were reacted with each other.

Next, 11.5 g of NMP, in which 7.7 g (44.6 mmol) of 5-ethynyl-isobenzofuran-1,3-dione was dissolved, was added to the liquid solution, the liquid solution was stirred for 2 hours so that the reaction was completed to obtain a reaction mixture.

The reaction mixture was filtered, and then put into a liquid solution containing water and methanol in a volume ratio of 3:1 so that a precipitate was produced in the liquid solution. Thereafter, the produced precipitate was filtered and washed using water sufficiently, and then dried under a vacuum condition to thereby obtain a polyamide resin (a-1).

In this regard, it is to be noted that an amount of cyclic chemical structures containing nitrogen atoms contained in the obtained polyamide resin (a-1) was 0 wt %.

Comparative Example 2

A positive type photosensitive resin composition was obtained in the same manner as in the Example 1 except that the following polyamide resin (a-2) was used instead of the polyamide resin (A-1).

Synthesis of Polyamide Resin (a-2)

83.9 g (170.3 mmol) of a mixture of dicarboxylic acid ester derivatives obtained by reacting 35.2 g (136.3 mmol) of diphenylether-4,4'-dicarboxylic acid, 5.7 g (34.5 mmol) of isophthalic acid and 46.0 g (340.6 mmol) of 1-hydroxy-1,2,3-benzotriazole with each other, 41.6 g (179.0 mmol) of 4,4'-oxybis(2-aminophenol), and 4.6 g (44.3 mmol) of 5-amino-1H-tetrazole 1-hydrate were put into a four-necked separable flask equipped with a thermometer, a stirrer, a raw material input port and a dry nitrogen gas-introducing tube.

Thereafter, 363.5 g of N-methyl-2-pyrrolidone (NMP) was added to the above materials so that they were dissolved into the NMP to obtain a liquid solution, and then the liquid solution was stirred at room temperature for 2 hours.

Thereafter, the liquid solution was heated at 75° C. for 12 hours using an oil bath so that the dicarboxylic acid ester derivatives, the 4,4'-oxybis(2-aminophenol) and the 5-amino-1H-tetrazole 1-hydrate were reacted with each other.

Next, the liquid solution was cooled up to room temperature, and then was subjected to the same treatment as the Example 1 to thereby obtain a polyamide resin (a-2).

In this regard, it is to be noted that an amount of cyclic chemical structures containing nitrogen atoms contained in the obtained polyamide resin (a-2) was 5.3 wt %.

Comparative Example 3

A positive type photosensitive resin composition was obtained in the same manner as in the Example 1 except that it was manufactured as follows.

100 g of the polyamide resin (a-1) synthesized in the Comparative Example 1, 17 g of the photosensitive diazoquinone (B-1) and 3 g of 5-amino-1H-tetrazole were dissolved into 300 g of γ-butyrolactone (GBL), and then filtered using a filter having a pore size of 0.2 μm and made of fluororesin to thereby obtain the positive type photosensitive resin composition.

The following evaluations were carried out to the photosensitive resin compositions obtained in the Examples 1 to 11 and the Comparative Examples 1 to 3. Obtained results were indicated in the following Table 1 together with contents of evaluation items 1. Adhesiveness to Copper A Ti sputtering film having a thickness of 500 Å was formed on a silicon wafer, and then a Cu sputtering film having a thickness of 3,000 Å was formed on the Ti sputtering film.

Next, a coating film was formed on the Cu sputtering film by applying each of the positive type photosensitive resin compositions obtained in the Examples 1 to 11 and the Comparative Examples 1 to 3 using a spin coater so as to have a thickness of 5 μm when being cured.

Thereafter, the coating film was dried at 120° C. for 4 minutes using a hot plate, and then was cured at 250° C. for 90 minutes under an atmosphere having an oxygen concentration of 1,000 ppm or less using a clean oven to thereby obtain a cured film (protective film).

Next, using a cutter knife, the cured film was separated to 100 square areas each having a size of 1×1 mm to obtain a sample. In this regard, the 100 square areas were provided so as to array 10 lines each including 10 square areas arrayed in a lengthwise direction in a lateral direction. The thus obtained sample was subjected to a pressure cooker test (PCT) under a condition of 125° C., 100% and 0.2 MPa for 500 hours continuously.

Next, an adhesive tape was stuck on the samples, and then was peeled off therefrom at once. And the number of the samples peeled off from the Cu sputtering film was counted.

2. Mechanical Property

A coating film was formed on a silicon wafer having a size of 6 inches by applying each of the positive type photosensitive resin compositions obtained in the Examples 1 to 11 and the Comparative Examples 1 to 3 using a spin coater so as to have a thickness of 10 μm when being cured.

Thereafter, the coating film was dried at 120° C. for 4 minutes using a hot plate, and then was cured at 250° C. for 90 minutes under an atmosphere having an oxygen concentration of 1,000 ppm or less using a clean oven to thereby obtain a cured film.

Next, the cured film of each silicon wafer was cut using a dicing saw so as to form a plurality of strip parts each having a width of 10 mm. Thereafter, each silicon wafer was immersed into a 2% hydrofluoric water to obtain the strip parts each released from the silicon wafer.

Next, a tensile measurement of the obtained strip parts was carried out using a tensile measuring apparatus at speed of 5 mm/min, and then tensile elongation percentage was evaluated.

3. Developing Property

Each of the positive type photosensitive resin compositions obtained in the Examples 1 to 11 and the Comparative Examples 1 to 3 was applied onto 10 silicon wafers using a spin coater, and then was dried at 120° C. for 4 minutes using a hot plate to thereby obtain a dry film (protective film) having a thickness of about 5 μm on each silicon wafer.

Thereafter, an ultraviolet ray was irradiated onto each obtained dry film using a high pressure mercury vapor lamp through a mask ("test chart No. 1", produced by TOPPAN PRINTING Co., LTD.), while adjusting an irradiance (exposure) thereof depending on each obtained dry film.

In this regard, it is to be noted that the mask had patterns to be not removed and patterns to be removed, and a width of each pattern was in the range of 0.88 to 50 μm.

Next, each silicon wafers was immersed into a 2.38% tetramethyl ammonium hydroxide aqueous solution for 80 seconds so that irradiated portions of the dry film were removed to form removed portions in each dry film, and then was rinsed for 30 seconds using a purified water.

Thereafter, in each dry film, the removed portion having a width of 50 μm was checked, and its state was evaluated. In this regard, it is to be noted that symbols A to D shown in Table 1 indicated the following contents.

A: In all 10 dry films, the removed portions were patterned without scums.

B: In 7 to 9 dry films among the 10 dry films, the removed portions were patterned without scums.

C: In all 10 dry films, the removed portions were patterned with a few scums at peripheries of openings thereof.

D: In all 10 dry films, the removed portions were patterned with many scums, or were not patterned.

4. Flux Resistance

The above silicon wafers each having the patterned dry film were heated at 250° C. for 90 minutes under an atmosphere having an oxygen concentration of 1,000 ppm or less using a clean oven so that the patterned dry films were cured to thereby obtained cured films.

Next, a flux ("BF-30", produced by TAMURA KAKEN CORPORATION) was applied onto each of the silicon wafers using a spinner at 500 rpm for 5 seconds, and then at 1,000 rpm for 30 seconds. Thereafter, the flux was pre-heated at 140 to 160° C. for 100 seconds, and then was heated at 250° C. for 10 seconds by passing each silicon wafer thorough a reflow furnace. This cycle was consecutively carried out twice.

Next, each of the silicon wafers was washed for 10 minutes using xylene heated at 40° C. to remove the flux therefrom, was rinsed using isopropyl alcohol, and then was dried. Thereafter, a surface of each cured film was checked using a metallographical microscope, and its state was evaluated. In this regard, it is to be noted that symbols A to D shown in Table 1 indicated the following contents.

A: In all 10 cured films, the surfaces thereof had no rucks in whole.

B: In 7 to 9 cured films among the 10 cured films, the surfaces thereof had no rucks in whole.

C: In all 10 cured films, the surfaces thereof had rucks in part.

D: In all 10 cured films, the surfaces thereof had rucks in whole.

Furthermore, in each of the Examples 1 to 11, the cured film also had excellent tensile elongation percentage. This result indicated that the cured film has an excellent film physical property.

Moreover, in each of the Examples 1 to 3 and 5, the dry film (protective film) had an excellent developing property.

In addition, each of the positive type photosensitive resin compositions obtained in the Examples 1 to 11 and the Comparative Examples 1 to 3 was applied onto semiconductor elements provided on a substrate to form a coating film. The formed coating film was pre-baked at 60 to 130° C. so that it was dried to obtain a dry film, and then an ultraviolet ray was irradiated onto the dry film at a predetermined pattern.

Next, portions of the dry film, where the ultraviolet ray was irradiated, were removed using a developing solution to obtain a relief pattern, and then the relief pattern was subjected to a heat treatment to obtain a protective film which also could function as an insulating film.

After forming the protective film, semiconductor devices were manufactured through steps including a dicing step in which the substrate was cut to a plurality of chips, a mounting step in which each diced chip was mounted onto a circuit board, a wire bonding step, and a sealing step in which each chip was sealed by a sealing compound. The thus obtained semiconductor devices normally operated.

Industrial Applicability

According to the present invention, it is possible to provide a photosensitive resin composition which has excellent adhesiveness to a wiring made of copper and copper alloy and can be cured at a low temperature.

In a semiconductor element field or a crystalline liquid display element field being representative of a display ele-

TABLE 1

| | Polyamide Resin | Photosensitive Agent | Solvent | Additive Agent | Adhesiveness to Copper | Tensile Elongation Percentage | Developing Property | Flux Resistance |
|---|---|---|---|---|---|---|---|---|
| Ex. 1 | A-1 | B-1 | GBL | — | 0 | 40% | A | A |
| Ex. 2 | A-2 | B-1 | GBL | — | 0 | 38% | A | A |
| Ex. 3 | A-3 | B-1 | GBL | — | 0 | 41% | A | A |
| Ex. 4 | A-4 | B-1 | GBL | — | 0 | 45% | B | A |
| Ex. 5 | A-5 | B-1 | GBL | — | 0 | 39% | A | A |
| Ex. 6 | A-6 | B-1 | GBL | — | 0 | 42% | B | A |
| Ex. 7 | A-7 | B-1 | GBL | — | 0 | 20% | B | A |
| Ex. 8 | A-8 | B-1 | GBL | — | 0 | 35% | B | B |
| Ex. 9 | A-9 | B-1 | GBL | — | 0 | 41% | B | A |
| Ex. 10 | A-10 | B-1 | GBL | — | 0 | 46% | B | A |
| Ex. 11 | A-11 | B-1 | GBL | — | 0 | 42% | B | A |
| Com. Ex. 1 | a-1 | B-1 | GBL | — | 100 | 45% | B | B |
| Com. Ex. 2 | a-2 | B-1 | GBL | — | 0 | 15% | B | C |
| Com. Ex. 3 | a-1 | B-1 | GBL | 5-amino-1H-tetrazole | 100 | 45% | B | B |

As can be seen from Table 1, in each of the Examples 1 to 11, the number of the samples peeled off from the Cu sputtering film was "0". This result indicated that the cured film (protective film) had excellent adhesiveness to copper.

Further, in each of the Examples 1 to 11, the cured film (protective film) also had excellent flux resistance, namely, even in the case where the cured film was obtained by a curing treatment having a low temperature of 250° C., rucks and the like did not occur on the surface thereof. This result indicated that the cured film had an excellent curing property at a low temperature.

ment field, such a photosensitive resin composition can be preferably used for forming a protective film, an insulating film and the like.

An insulating film, a protective film and electronic equipment, which are formed using the photosensitive resin composition, can have improved reliability. Thus, the present invention has industrial applicability.

What is claimed is:

1. A photosensitive resin composition, comprising:
an alkali soluble resin including molecules each composed of a main chain having one end and the other end opposite to the one end, an organic group bonded to the one end thereof, the organic group having at least one unsaturated group, and a substituent group bonded to at least one of the other end of the main chain and a branch thereof, the substituent group having a pyrazole group as a cyclic chemical structure containing nitrogen atoms;
a photosensitive agent; and
a compound having phenolic hydroxyl groups
wherein the pyrazole group is selected from the group consisting of a 3-(1H-pyrazoyl)amino group, a 4-(1H-pyrazoyl)amino group, a 5-(1H-pyrazoyl)amino group, a 1-(3-methyl-1H-pyrazoyl) amino group, a 1-(4-methyl-1H-pyrazoyl) amino group and a 1-(5-methyl-1H-pyrazoyl) amino group.

2. The photosensitive resin composition as claimed in claim 1, wherein an amount of the cyclic chemical structures containing nitrogen atoms is in the range of 1.0 to 10.0 wt % with respect to a total weight of the molecules included in the alkali soluble resin.

3. The photosensitive resin composition as claimed in claim 1, wherein the organic group having the at least one unsaturated group is an organic group having at least one triple bond.

4. The photosensitive resin composition as claimed in claim 1, wherein the main chain of each of the molecules included in the alkali soluble resin has at least one of a chemical structure which can change to a polybenzoxazole structure and a chemical structure which can change to a polyimide structure.

5. An insulating film composed of a cured product of the photosensitive resin composition defined by claim 1.

6. A protective film composed of a cured product of the photosensitive resin composition defined by claim 1.

7. The protective film as claimed in claim 6, wherein the protective film is used for protecting a semiconductor element or a liquid crystal display element.

8. Electronic equipment provided with the protective film defined by claim 6.

9. Electronic equipment provided with the insulating film defined by claim 5.

10. The photosensitive resin composition as claimed in claim 1, wherein the compound having the phenolic hydroxyl groups is at least one of chemical structures represented by the following formulas (2-1), (2-2) and (2-3)

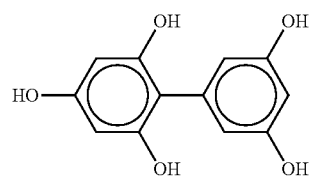

(2-1)

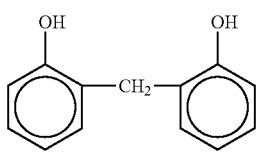

(2-2)

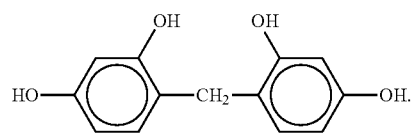

(2-3)

* * * * *